US008653506B2

(12) United States Patent
Shimoji

(10) Patent No.: US 8,653,506 B2
(45) Date of Patent: Feb. 18, 2014

(54) ORGANIC ELECTROLUMINESCENCE DEVICE INCLUDING ORGANIC LAYER ARRANGED BETWEEN TRANSPARENT ELECTRODE AND METAL ELECTRODE, AND MANUFACTURING METHOD THEREOF

(75) Inventor: Noriyuki Shimoji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 148 days.

(21) Appl. No.: 12/664,594

(22) PCT Filed: May 9, 2008

(86) PCT No.: PCT/JP2008/058656
§ 371 (c)(1),
(2), (4) Date: May 28, 2010

(87) PCT Pub. No.: WO2008/152869
PCT Pub. Date: Dec. 18, 2008

(65) Prior Publication Data
US 2010/0243997 A1    Sep. 30, 2010

(30) Foreign Application Priority Data

Jun. 14, 2007   (JP) .................................. 2007-157500

(51) Int. Cl.
*H01L 29/08*          (2006.01)
(52) U.S. Cl.
USPC ........................ 257/40; 257/E51.026; 438/46
(58) Field of Classification Search
USPC ................. 257/40, E51.026; 438/46
See application file for complete search history.

(56) References Cited

U.S. PATENT DOCUMENTS

| 6,037,712 | A  * | 3/2000 | Codama et al. | 313/498 |
| 6,150,187 | A  * | 11/2000 | Zyung et al. | 438/26 |
| 6,195,142 | B1 * | 2/2001 | Gyotoku et al. | 349/69 |
| 6,525,339 | B2 * | 2/2003 | Motomatsu | 257/40 |
| 6,825,900 | B2 * | 11/2004 | Kawashima | 349/106 |
| 6,833,668 | B1 * | 12/2004 | Yamada et al. | 313/505 |
| 6,924,594 | B2 * | 8/2005 | Ogura et al. | 313/506 |
| 6,943,496 | B2 * | 9/2005 | Hishida | 313/512 |
| 7,034,911 | B2 * | 4/2006 | Kato | 349/113 |
| 7,226,332 | B2 * | 6/2007 | Arai et al. | 445/24 |
| 7,548,023 | B2 * | 6/2009 | Yamazaki et al. | 313/512 |
| 7,572,478 | B2 * | 8/2009 | Ogura et al. | 427/66 |
| 7,579,774 | B2 * | 8/2009 | Yamazaki et al. | 313/505 |
| 7,915,818 | B2 * | 3/2011 | Kim | 313/506 |
| 8,253,327 | B2 * | 8/2012 | Ibe et al. | 313/512 |

(Continued)

FOREIGN PATENT DOCUMENTS

| JP | 9-245964 | 9/1997 |
| JP | 10-247587 | 9/1998 |

(Continued)

*Primary Examiner* — Kimberly Rizkallah
*Assistant Examiner* — Caleb Henry
(74) *Attorney, Agent, or Firm* — Hamre, Schumann, Mueller & Larson, P.C.

(57) ABSTRACT

An organic electroluminescence device includes: a first electrode layer; an insulating film arranged on the first electrode layer; an organic layer that is arranged on the insulating film, and is in contact with the first electrode layer at an opening portion provided in the insulating film; a second electrode layer arranged on the organic layer; and a metal layer that is in contact with an end surface of the organic layer and an end surface of the second electrode layer, and is arranged on the second electrode layer.

7 Claims, 3 Drawing Sheets

(56) References Cited

U.S. PATENT DOCUMENTS

| | | | |
|---|---|---|---|
| 2002/0155215 A1* | 10/2002 | Miyashita et al. | 427/66 |
| 2003/0214231 A1* | 11/2003 | Hishida | 313/506 |
| 2004/0160167 A1* | 8/2004 | Arai et al. | 313/500 |
| 2004/0178722 A1* | 9/2004 | Cok et al. | 313/506 |
| 2005/0042477 A1* | 2/2005 | Miyashita et al. | 428/690 |
| 2005/0275346 A1* | 12/2005 | Eida et al. | 313/504 |
| 2006/0061272 A1* | 3/2006 | McCormick et al. | 313/512 |
| 2007/0096641 A1* | 5/2007 | Hasegawa et al. | 313/504 |
| 2008/0042562 A1* | 2/2008 | Hayashi | 313/512 |

FOREIGN PATENT DOCUMENTS

| | | |
|---|---|---|
| JP | 10-335060 | 12/1998 |
| JP | 2000-058270 | 2/2000 |
| JP | 2000-113982 | 4/2000 |
| JP | 2001-052863 | 2/2001 |
| JP | 2002-063991 | 2/2002 |
| JP | 2003-059653 | 2/2003 |
| JP | 2005-302738 | 10/2005 |
| JP | 2005-353398 | 12/2005 |
| JP | 2007-103048 | 4/2007 |
| JP | 2008-159438 | 7/2008 |

* cited by examiner

ORGANIC ELECTROLUMINESCENCE DEVICE INCLUDING ORGANIC LAYER ARRANGED BETWEEN TRANSPARENT ELECTRODE AND METAL ELECTRODE, AND MANUFACTURING METHOD THEREOF

TECHNICAL FIELD

The present invention relates to an organic electroluminescence device including an organic layer arranged between a transparent electrode and a metal electrode, and to a manufacturing method of the organic electroluminescence device.

BACKGROUND ART

In recent years, an organic electroluminescence (hereinafter, referred to as "organic EL") device that emits light by using recombination of electrons and holes, which are injected into organic matter, has been used in lighting and display devices, and the like. Heretofore, in manufacturing of a device including the organic EL device, patterning has been performed by using a diaphragm, a shadow mask or the like, which is made of a photoresist film. In this event, an end surface of an organic EL layer included in the organic EL device is exposed to an ambient atmosphere, and accordingly, oxygen, moisture and the like are brought into contact with the end surface of the organic EL layer, whereby quality deterioration of the organic EL device has been caused by oxidation of the organic EL layer, and the like. Therefore, in general, the organic EL device is sealed together with a drying agent into a sealing tube using a glass or metal cap and the like (for example, refer to Patent Citation 1). Meanwhile, in the case where the sealing tube is not used, an insulating film as inorganic matter is formed on the end surface of the organic EL layer by a sputtering method, a plasma chemical vapor deposition (CVD) method and the like after forming the organic EL layer, whereby the organic EL layer has been protected from the oxygen, the moisture and the like.

[Patent Citation 1] Japanese Patent Laid-Open Publication No. 2007-103048)

DISCLOSURE OF INVENTION

Technical Problem

However, there have been problems that a manufacturing process of the organic EL device becomes complicated by the fact that the organic EL device is sealed together with the drying agent in the sealing tube, and that the organic EL layer is damaged in the case of forming the insulating film by the plasma CVD method and the like.

Technical Solution

In consideration of the above-described problems, it is an object of the present invention to provide an organic EL device capable of preventing such complication of the manufacturing process and suppressing the quality deterioration, and to provide a manufacturing method of the EL device.

In accordance with an aspect of the present invention, an organic EL device is provided, which includes: a first electrode layer; an insulating film arranged on the first electrode layer; an organic layer that is arranged on the insulating film, and is in contact with the first electrode layer at an opening portion provided in the insulating film; a second electrode layer arranged on the organic layer; and a metal layer that is in contact with an end surface of the organic layer and an end surface of the second electrode layer, and is arranged on the second electrode layer.

In accordance with another aspect of the present invention, a manufacturing method of an organic electroluminescence device is provided, which includes: forming a first electrode layer; forming an insulating film on the first electrode layer; removing apart of the insulating film until apart of a surface of the first electrode layer is exposed so as to form an opening portion; forming an organic layer and a second electrode layer in this order on the insulating film, and bringing the first electrode layer and the organic layer into contact with each other at the opening portion; and forming a metal layer on the second electrode layer, and bringing the metal layer into contact with an end surface of the organic layer and an end surface of the second electrode layer.

Advantageous Effects

In accordance with the present invention, the organic EL device capable of preventing the complication of the manufacturing process and suppressing the quality deterioration can be provided, and the manufacturing method of the organic EL device can be provided.

BEST MODE FOR CARRYING OUT THE INVENTION

Figure 1:
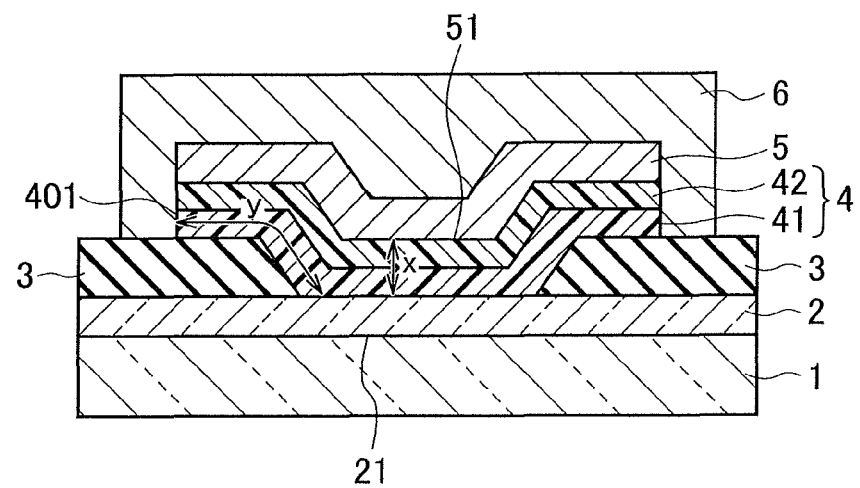
FIG. 1 is a schematic cross-sectional view showing a configuration of an organic EL device according to an embodiment of the present invention.

Next, a description will be made of embodiments of the present invention with reference to the drawings. In the following description referring to the drawings, the same or similar reference numerals are assigned to the same or similar portions. However, the drawings are schematic, and it should be noted that a relationship between thicknesses and planar dimensions, a ratio of thicknesses of the respective layers, and the like are different from the actual ones. Hence, specific thicknesses and dimensions should be determined in consideration of the following description. Moreover, it is a matter of course that portions different in dimensional relationship and ratio are also included among the respective drawings.

Moreover, the embodiments described below illustrate an apparatus and a method, which are for embodying the technical idea of this invention, and the technical idea of this invention does not specify materials, shapes, structures, arrangements and the like of constituent components to those in the following description. The technical idea of this invention can be modified in various ways within the scope of claims.

As shown in FIG. 1, an organic EL device according to the embodiment of the present invention includes: a first electrode layer 2; an insulating film 3 arranged on the first electrode layer 2; an organic layer 4 that is arranged on the insulating film 3, and is in contact with the first electrode layer 2 at an opening portion provided in the insulating film 3; a second electrode layer 5 arranged on the organic layer 4; and a metal layer 6 that is in contact with an end surface of the organic layer 4 and an end surface of the second electrode layer 5, and is arranged on the second electrode layer 5.

The organic layer 4 shown in FIG. 1 has a structure in which a hole transportation layer 41 and an electron transportation layer 42 are stacked on each other. For example, a naphthyl-diphenyl-diamine (NPD) film and the like are adoptable for the hole transportation layer 41, and an aluminum-quinolinol complex ($Alq_3$) film and the like are adoptable for the electron transportation layer 42.

In the organic EL device shown in FIG. 1, the first electrode layer 2 is formed into a transparent anode electrode, and the second electrode layer 5 is formed into a metal cathode electrode, whereby an electric field is applied to the organic layer 4, and light is generated in the organic layer 4. To be more specific, holes are supplied from the first electrode layer 2 to the hole transportation layer 41, and electrons are supplied from the second electrode layer 5 to the electron transportation layer 42. Then, light generated by using recombination of the holes and the electrons is discharged from the organic layer 4, and transmits through the first electrode layer 2 as a transparent electrode layer and a transparent substrate 1, and the light is emitted to the outside of the organic EL device. For example, in the case where the NPD film and the $Alq_3$ film are adopted for the hole transportation layer 41 and the electron transportation layer 42, respectively, the light is emitted from the hole transportation layer 42.

For example, a glass substrate or a plastic substrate is adoptable for the transparent substrate 1 through which the light emitted from the organic layer 4 transmits. A transparent electrode based on an oxide such as indium tin oxide (ITO) and indium zinc oxide (IZO) is adoptable for the first electrode layer 2. A film of an alloy of magnesium-silver (MgAg), an aluminum (Al) film and the like are adoptable for the second electrode layer 5.

The first electrode layer 2 is electrically isolated from the second electrode layer 5 and the metal layer 6 by the insulating film 3. For the insulating film 3, an inorganic insulating film such as a silicon oxide ($SiO_2$) film, a silicon nitride (SiN) film and an alumina ($Al_2O_3$) film is adoptable.

As shown in FIG. 1, the metal layer 6 is arranged on upper and end surfaces of the second electrode layer 5, the end surface of the organic layer 4, and an upper surface of the insulating film 3. The metal layer 6 is used as a wiring layer to be connected to the second electrode layer 5. An Al film, a copper (Cu) film and the like are adoptable for the metal layer 6.

In the organic EL device shown in FIG. 1, the metal layer 6 is arranged on the second electrode layer 5 while being in contact with the end surface of the organic layer 4 and the end surface of the second electrode layer 5. In other words, peripheries of the organic layer 4, which exclude surfaces thereof in contact with the first electrode layer 2 and the second electrode layer 5, are covered with the insulating film and the metal layer 6. Accordingly, the organic layer 4 is shielded from the outside, and deterioration of the organic layer 4, which is caused by oxygen, moisture and the like, does not occur. Hence, it is not necessary to seal the organic EL device by a sealing tube made of glass or metal. Moreover, damage does not occur, which is suffered on the organic layer 4 by the fact that the insulating film is formed on the end surface of the organic layer 4 by the plasma CVD method and the like. Furthermore, invasion of the oxygen, the moisture and the like from the transparent substrate 1 to the organic layer 4 is prevented by the first electrode layer 2.

Note that, preferably, a distance at which the end portion of the organic layer 4 on the insulating film 3 overlaps an end portion of the opening portion of the insulating film 3 is set at such a fixed value or more that does not allow a flow of a leak current between the first electrode layer 2 and the second electrode layer 5 through the metal layer 6. Here, when a shortest distance from an end surface 401 of the organic layer 4, which is in contact with the metal layer 6, to a contact surface 21 between the first electrode layer 2 and the organic layer 4 is defined as y, in the case where the electric field for allowing the light emission of the organic layer 4 is applied between the first electrode layer 2 and the second electrode layer 5, the distance y is set so that the electric field generated between the first electrode layer 2 and the second electrode layer 5 is sufficiently larger than an electric field generated between the first electrode layer 2 and the metal layer 6. For example, it is preferable that the distance y be twice or more a distance x between the first electrode layer 2 and the second electrode layer 5, which interposes the organic layer 4 therebetween (hence, the distance x is a thickness of the organic layer 4), that is, a distance from the contact surface 21 between the first electrode layer 2 and the organic layer 4 to a contact surface 51 between the organic layer 4 and the second electrode layer 5. The distances x and y are set as described above, whereby the electric field generated between the first electrode layer 2 and the second electrode layer 5 can be increased more than the electric field generated between the first electrode layer 2 and the metal layer 6 within a range where the leak current does not flow between the first electrode layer 2 and the second electrode layer 5 through the metal layer 6.

Figure 2:
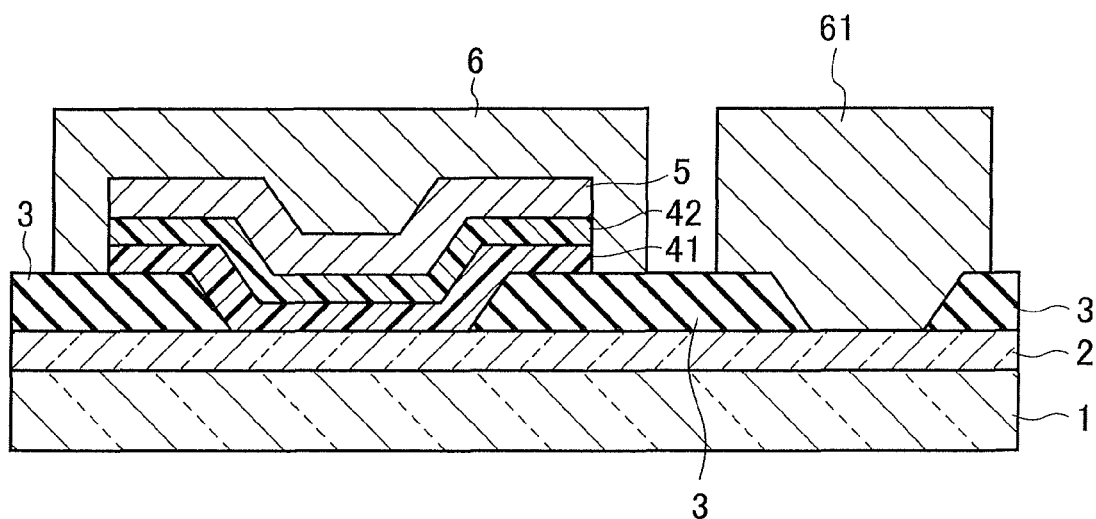
FIG. 2 is a schematic cross-sectional view showing another configuration of the organic EL device according to the embodiment of the present invention.

Moreover, as shown in FIG. 2, an extraction electrode layer 61 that is in contact with the first electrode layer 2 at an opening portion of the insulating film 3, which is provided at a position different from a position where the organic layer 4 is formed, can be arranged. In an organic EL device shown in FIG. 2, the extraction electrode layer 61 functions as a wiring layer for the first electrode layer 2, and the first electrode layer 2 can be set at a desired potential through the extraction electrode layer 61. Note that the extraction electrode layer 61 can be formed in the same step as that for the metal layer 6. In this case, material and film thickness of the extraction electrode layer 61 are the same as those of the metal layer 6.

As described above, in the organic EL device according to the embodiment of the present invention, the end surface of the organic layer 4 is shielded from the outside by the metal layer 6, and the deterioration of the organic layer 4, which is caused by the oxygen, the moisture and the like, does not occur. Therefore, it is not necessary to seal the organic EL device by the sealing tube and the like, and the complication of the manufacturing process is reduced. Moreover, there is no damage on the organic layer 4, which is caused by the fact that the insulating film is formed on the end surface of the organic layer 4 by the plasma CVD method and the like. Therefore, the quality deterioration of the organic EL device can be suppressed.

By using FIG. 3 to FIG. 6, a description will be made of a manufacturing method of the organic EL device according to the embodiment of the present invention. Note that the manufacturing method of the organic EL device, which will be described below, is merely an example, and it is a matter of course that the organic EL device is realizable by a variety of manufacturing methods including modification examples of the following manufacturing method.

Figure 3:
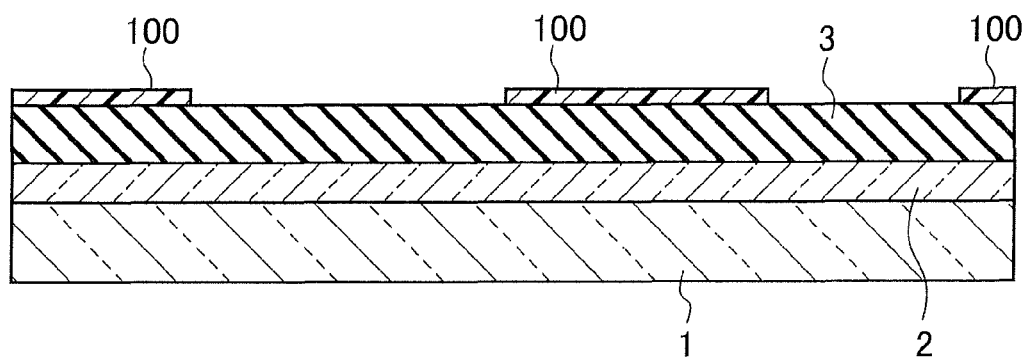
FIG. 3 is a process cross-sectional view for explaining a manufacturing method of the organic EL device according to the embodiment of the present invention.

(A) On a surface of a glass substrate with a thickness of approximately 1 mm, which is the transparent substrate 1, ITO is formed as the first electrode layer 2 at a thickness of approximately 100 nm by a sputtering method and the like. After the first electrode layer 2 is formed into a desired pattern by a photolithography technology, the insulating film 3 made of $SiO_2$ is formed at a thickness of approximately 100 nm entirely on of the transparent substrate 1 and the first electrode layer 2 by the sputtering method and the like. Then, a photoresist film 100 is applied on the insulating film 3, and is then exposed and developed by the photolithography technology, whereby an etching mask is formed, and a structure cross-sectional view of FIG. 3 is obtained.

Figure 4:
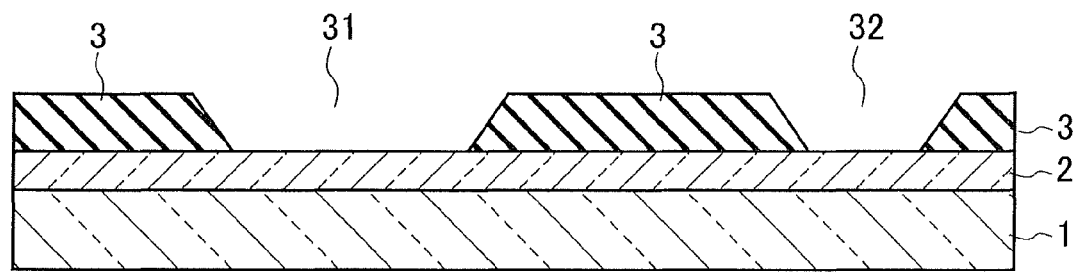
FIG. 4 is a process cross-sectional view for explaining the manufacturing method of the organic EL device according to the embodiment of the present invention.

(B) Next, by using this etching mask, a part of the insulating film 3 is selectively removed by etching by a technology such as a reactive ion etching (RIE) method and the like until a part of the surface of the first electrode layer 2 is exposed. In such a way, opening portions 31 and 32 are formed as shown in FIG. 4.

Figure 5:
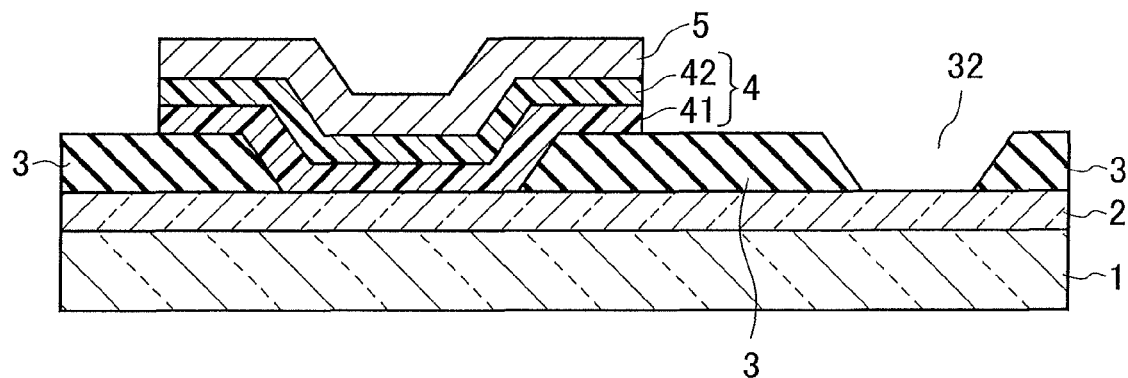
FIG. 5 is a process cross-sectional view for explaining the manufacturing method of the organic EL device according to the embodiment of the present invention.

(C) Subsequently, the organic layer 4 with a thickness of approximately 100 nm and the second electrode layer 5 with a thickness of approximately 100 nm are continuously evaporated by using the same shadow mask in vacuum so as to fill the opening portion 31, whereby a structure cross-sectional view of FIG. 5 is obtained. Here, a configuration is adopted, in which the hole transportation layer 41 composed of an NPD film with a thickness of 50 nm and the electron transportation layer 42 composed of an $Alq_3$ film with a thickness of 50 nm are stacked on each other in this order. Moreover, the second electrode layer 5 is composed of an Al film. Note that, preferably, across section of a peripheral portion of the opening portion 31 is formed into a tapered shape so that the organic layer 4 and the like can be sufficiently deposited also on corner portions of the opening portion 31.

Figure 6:
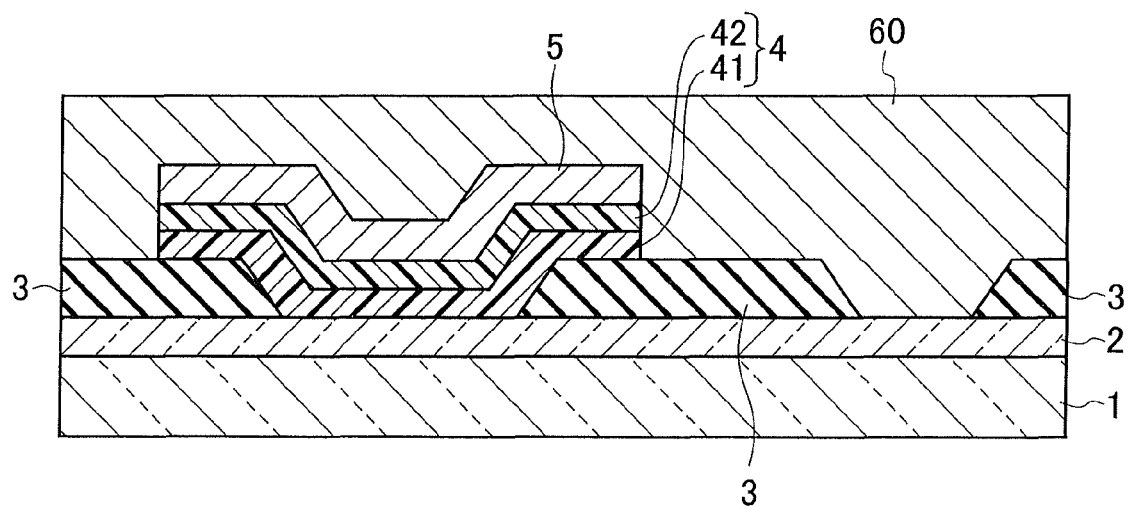
FIG. 6 is a process cross-sectional view for explaining the manufacturing method of the organic EL device according to the embodiment of the present invention.

(D) Next, as shown in FIG. 6, a metal film 60 composed of an Al film with a thickness of approximately 1 μm is formed entirely on the insulating film 3 and the second electrode layer 5 by the sputtering method so as to be brought into contact with the end surface of the second electrode layer 5 and the end surface of the organic layer 4. At this time, the opening portion 32 is filled with the metal film 60. Then, the metal film 60 is patterned by the photolithography technology, whereby the metal layer 6 and the extraction electrode layer 61 are formed. In such a way, the organic EL device shown in FIG. 2 is completed.

In accordance with the manufacturing method of the organic EL device according to the embodiment of the present invention, which is as described above, the organic EL device is manufactured, in which the end surface of the organic layer 4 is shielded from the outside by the metal layer 6 formed as the wiring layer. Therefore, even if such a manufacturing process after the organic layer 4 is formed is implemented without sealing the organic EL device by the sealing tube and the like, the deterioration of the organic layer 4, which is caused by the oxygen, the moisture and the like, is suppressed. Therefore, the complication of the manufacturing process of the device using the organic EL device can be prevented.

Moreover, since the organic layer 4 and the second electrode layer 5 are formed continuously in vacuum by using the same shadow mask, it is not necessary to change the shadow mask, and the manufacturing process is shortened. Furthermore, since an occurrence of particles in a manufacturing apparatus at the time of changing the shadow mask can be reduced, the quality of the organic EL device can be enhanced. Moreover, since the second electrode layer 5 and the metal layer 6 are formed in different steps, it is possible to adopt a sputtering method in which a forming time is short in terms of conditions, and the like in the forming step of the metal layer 6 used as the wiring layer, in which the film thickness is thick.

As shown in FIG. 1 and FIG. 2, since the organic layer 4 of the organic EL device is covered with the metal layer 6 thereof, the organic layer 4 is not damaged even if the plasma CVD method and the like are used in the steps after the metal layer 6 is formed. Therefore, after the metal layer 6 is formed, it is not necessary to consider to apply a manufacturing method, manufacturing conditions and the like, which do not damage the organic layer 4, and options to select the materials and the manufacturing method can be widened. Moreover, since limitations on the manufacturing method and manufacturing condition are reduced, it is also possible to shorten a manufacturing period of the device including the organic EL device.

OTHER EMBODIMENTS

As described above, the present invention has been described based on the embodiment; however, it should not be understood that the description and the drawings, which form a part of the disclosure, limit this invention. From this disclosure, a variety of alternative embodiments, examples and operation technologies will be obvious for those skilled in the art.

In the already made description of the embodiment, the structure has been illustrated, in which the organic layer 4 is composed of the hole transportation layer 41 and the electron transportation layer 42; however, the organic layer 4 may include a light emitting layer which is arranged between the hole transportation layer 41 and the electron transportation layer 42. Moreover, the organic layer may include a hole injection layer, an electron injection layer and the like.

As described above, it is a matter of course that the present invention incorporates a variety of embodiments and the like, which are not described herein. Hence, the technical scope of the present invention should be determined only by the invention specifying items according to the scope of claims reasonable from the above description.

[Industrial Applicability]

The organic electroluminescence device of the present invention and the manufacturing method thereof are usable for the semiconductor industry and the electronic instrument industry, which include a manufacturing industry that manufactures a light emitting device using the organic electroluminescence device.

The invention claimed is:
1. An organic electroluminescence device comprising:
a first electrode layer;
an insulating film arranged on the first electrode layer;
a lighting unit, comprising
   an organic layer arranged on the insulating film, the organic layer being in contact with the first electrode layer at a first opening portion provided in the insulating film;
   a second electrode layer arranged on the organic layer; and a metal layer arranged on the second electrode layer, the metal layer being in contact with an end surface of the organic layer and with an end surface of the second electrode layer; and an extraction electrode layer adjacent to the metal layer and being in contact with the first electrode layer, wherein the extraction electrode layer and the metal layer face each other, and a top surface of the metal layer and a top surface of the extraction electrode layer are flush with each other, and wherein peripheral surfaces of the organic layer are covered by the insulating film and the metal layer, except for surfaces of the organic layer in contact with the first electrode layer and the second electrode layer, for any lighting unit in the organic electroluminescence device.

2. The organic electroluminescence device of claim 1, wherein a distance from a contact surface between the first electrode layer and the organic layer to the end surface of the organic layer, the end surface being in contact with the metal layer, is twice or more a thickness of the organic layer.

3. The organic electroluminescence device of claim 1, wherein the organic layer has a stacked structure including a hole transportation layer and an electron transportation layer.

4. The organic electroluminescence device of claim 3, wherein the hole transportation layer is made of naphthyl-diphenyl-diamine, and the electron transportation layer is made of an aluminum-quinolinol complex.

5. The organic electroluminescence device of claim 1, wherein the first electrode layer is a transparent electrode layer.

6. The organic electroluminescence device of claim 5, wherein the transparent electrode layer is made of either of indium tin oxide and indium zinc oxide.

7. The organic electroluminescence device of claim 1, wherein the extraction electrode layer is in contact with the first electrode layer at a second opening portion in a region except a region where the organic layer is arranged, the second opening portion being provided in the insulating film.

* * * * *